United States Patent
Salter et al.

(10) Patent No.: US 12,060,055 B2
(45) Date of Patent: Aug. 13, 2024

(54) VEHICLE HAVING STEERING WHEEL SWITCHES AND METHOD TO REDUCE FALSE ACTUATION

(71) Applicant: Ford Global Technologies, LLC, Dearborn, MI (US)

(72) Inventors: Stuart C. Salter, White Lake, MI (US); Adrian Aguirre, Alvaro Obregon (MX); Michael John Kipley, Saline, MI (US); Pietro Buttolo, Dearborn Heights, MI (US); James Robert Chascsa, II, Farmington Hills, MI (US); Ross Kern, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 407 days.

(21) Appl. No.: 17/475,675

(22) Filed: Sep. 15, 2021

(65) Prior Publication Data
US 2023/0093271 A1 Mar. 23, 2023

(51) Int. Cl.
*B60W 30/02* (2012.01)
*B62D 1/04* (2006.01)

(52) U.S. Cl.
CPC ............... *B60W 30/02* (2013.01); *B62D 1/04* (2013.01); *B60W 2540/10* (2013.01); *B60W 2540/12* (2013.01); *B60W 2540/18* (2013.01)

(58) Field of Classification Search
CPC ............. B60W 30/02; B60W 2540/10; B60W 2540/12; B60W 2540/18; B62D 1/04
See application file for complete search history.

(56) References Cited

U.S. PATENT DOCUMENTS

| | | | |
|---|---|---|---|
| 9,481,246 B2 | 11/2016 | Kim et al. | |
| 9,505,430 B2 | 11/2016 | Burcar et al. | |
| 9,886,117 B2 | 2/2018 | Karasawa et al. | |
| 2009/0187311 A1* | 7/2009 | Christiansen | B62D 5/0469 701/41 |
| 2015/0180471 A1* | 6/2015 | Buttolo | B60R 16/005 307/116 |
| 2016/0221499 A1* | 8/2016 | Dean | B62D 1/046 |
| 2016/0221597 A1* | 8/2016 | Dean | B62D 1/10 |
| 2019/0023310 A1* | 1/2019 | Odate | G01D 5/241 |
| 2019/0092389 A1* | 3/2019 | McGill | B62D 1/22 |
| 2019/0095092 A1 | 3/2019 | Thomas et al. | |
| 2019/0337566 A1* | 11/2019 | Weidig | B62D 15/02 |
| 2020/0001882 A1* | 1/2020 | Wulf | B60W 30/18 |

(Continued)

*Primary Examiner* — Peter D Nolan
*Assistant Examiner* — Wae L Louie
(74) *Attorney, Agent, or Firm* — Vichit Chea; Price Heneveld LLP

(57) ABSTRACT

A vehicle is provided that includes a steering wheel, a steering wheel sensor sensing rotational movement of the steering wheel, an accelerator pedal actuatable to accelerate the vehicle, a brake pedal actuatable to decelerate the vehicle, and a sensor sensing a signal indicative of an acceleration or deceleration of the vehicle. The vehicle also includes at least one proximity switch located on the steering wheel, and a controller configured to process the rotational movement of the steering wheel and the sensed signal and control an interaction mode of the at least one input switch, wherein the controller changes the interaction mode of the at least one input switch based on the sensed steering wheel movement and the sensed signal.

20 Claims, 7 Drawing Sheets

(56) References Cited

U.S. PATENT DOCUMENTS

| | | | |
|---|---|---|---|
| 2020/0070833 A1* | 3/2020 | Suzuki | B62D 11/24 |
| 2022/0048552 A1* | 2/2022 | Salter | G06F 3/0219 |
| 2022/0055482 A1* | 2/2022 | Brissman | B62D 1/06 |
| 2022/0063700 A1* | 3/2022 | Salter | B62D 1/046 |
| 2023/0093271 A1* | 3/2023 | Salter | B60W 30/02 |
| | | | 701/41 |

* cited by examiner

VEHICLE HAVING STEERING WHEEL SWITCHES AND METHOD TO REDUCE FALSE ACTUATION

FIELD OF THE DISCLOSURE

The present disclosure generally relates to motor vehicles having input switches on the steering wheel, and more particularly relates to vehicle steering wheel switches and a method of reducing the likelihood of false actuation of the switches.

BACKGROUND OF THE DISCLOSURE

Motor vehicles are commonly equipped with various user inputs which may be located on a steering wheel for easy access to the driver of the vehicle. For example, input switches may be configured to provide inputs for radio controls, cruise control, microphone, and various other inputs. The input switches are commonly located on the front side of the steering wheel spokes and/or hub and on the back side of the steering wheel. Capacitive proximity switches are increasingly being employed on the vehicle. It would be desirable to provide for capacitive proximity switches on a steering wheel of a vehicle in a manner that reduces the likelihood of false actuations as the steering wheel is manipulated.

SUMMARY OF THE DISCLOSURE

According to a first aspect of the present disclosure, a vehicle is provided that includes a steering wheel, a steering wheel sensor sensing rotational movement of the steering wheel, an accelerator pedal actuatable to accelerate the vehicle, a brake pedal actuatable to decelerate the vehicle, a sensor sensing a sensed signal indicative of an acceleration or deceleration of the vehicle, at least one input switch located on the steering wheel, and a controller configured to process the sensed signal and the sensed rotational movement of the steering wheel and control an interaction mode of the at least one input switch, wherein the controller changes the interaction mode of the at least one input switch based on the sensed steering wheel movement and the sensed signal.

Embodiments of the first aspect of the disclosure can include any one or a combination of the following features:
the sensed signal is generated by a sensor sensing position or speed of the accelerator pedal;
the sensed signal is generated by a sensor sensing position or speed of the brake pedal;
the controller detects the sensed steering wheel movement exceeding a first threshold, and detects the sensed signal exceeding a second threshold;
the at least one proximity switch comprises a capacitive switch;
the change in the interaction mode comprises disabling the capacitive switch;
the controller further enables the capacitive switch based on the sensed steering wheel movement and the sensed signal;
the change in interaction mode comprises changing the interaction mode from a first interaction mode to a second interaction mode;
the first interaction mode comprises operating the capacitive switch with single touch and wherein the second interaction mode comprises operating the capacitive switch with at least one of a sliding gesture and double tap;
the sensed rotational movement of the steering wheel comprises sensed change in position of the steering wheel; and
the sensed rotational movement of the steering wheel comprises speed of rotation of the steering wheel.

According to a second aspect of the present disclosure, a vehicle is provide that includes a steering wheel, a steering wheel sensor sensing rotational movement of the steering wheel, an accelerator pedal having a first sensor for sensing an acceleration signal indicative of an acceleration of the vehicle, a brake pedal having a second sensor generating a brake signal indicative of braking of the vehicle, and at least one proximity switch located on the steering wheel. The vehicle also includes a controller configured to process the sensed acceleration signal, the sensed brake signal, and sensed rotational movement of the steering wheel and controlling an interaction mode of the at least one proximity switch, wherein the controller changes the interaction mode of the at least one proximity switch based on the rotational movement of the steering wheel movement and at least one of the sensed acceleration signal and the sensed brake signal.

Embodiments of the second aspect of the disclosure can include any one or a combination of the following features:
the controller detects the sensed movement of the steering wheel exceeding a predetermined first threshold, and detects at least one of the sensed acceleration signal and sensed braking signal exceeding a second threshold;
the at least one proximity switch comprises a capacitive switch;
the change in interaction mode comprises changing the interaction mode from a first interaction mode to a second interaction mode; and
the first interaction mode comprises operating the capacitive switch with single touch and wherein the second interaction mode comprises operating the capacitive switch with at least one of a sliding gesture and double tap.

According to a third aspect of the present disclosure, a method of controlling at least one proximity switch on a steering wheel of a vehicle. The method includes the steps of sensing rotational movement of the steering wheel, sensing acceleration of the vehicle, sensing braking of the vehicle, allowing at least one input switch to operate in a first activation mode when the steering wheel rotational movement is less than a first threshold, and operating the at least one input switch in a second interaction mode when the rotational movement of the steering wheel is greater than the first threshold and at least one of acceleration signal and braking signal is greater than a second threshold.

Embodiments of the third aspect of the disclosure can include any one or a combination of the following features:
the first interaction mode is a normal operation mode and the second interaction mode is a disabled mode that disables the at least one input switch;
the at least one input switch comprises at least one capacitive switch; and
the first interaction mode comprises operating the at least one capacitive switch in a touch mode and the second interaction mode comprises operating the at least one capacitive switch with one of sliding gesture and double tap.

These and other aspects, objects, and features of the present invention will be understood and appreciated by

DETAILED DESCRIPTION OF THE PREFERRED EMBODIMENTS

As required, detailed embodiments of the present disclosure are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
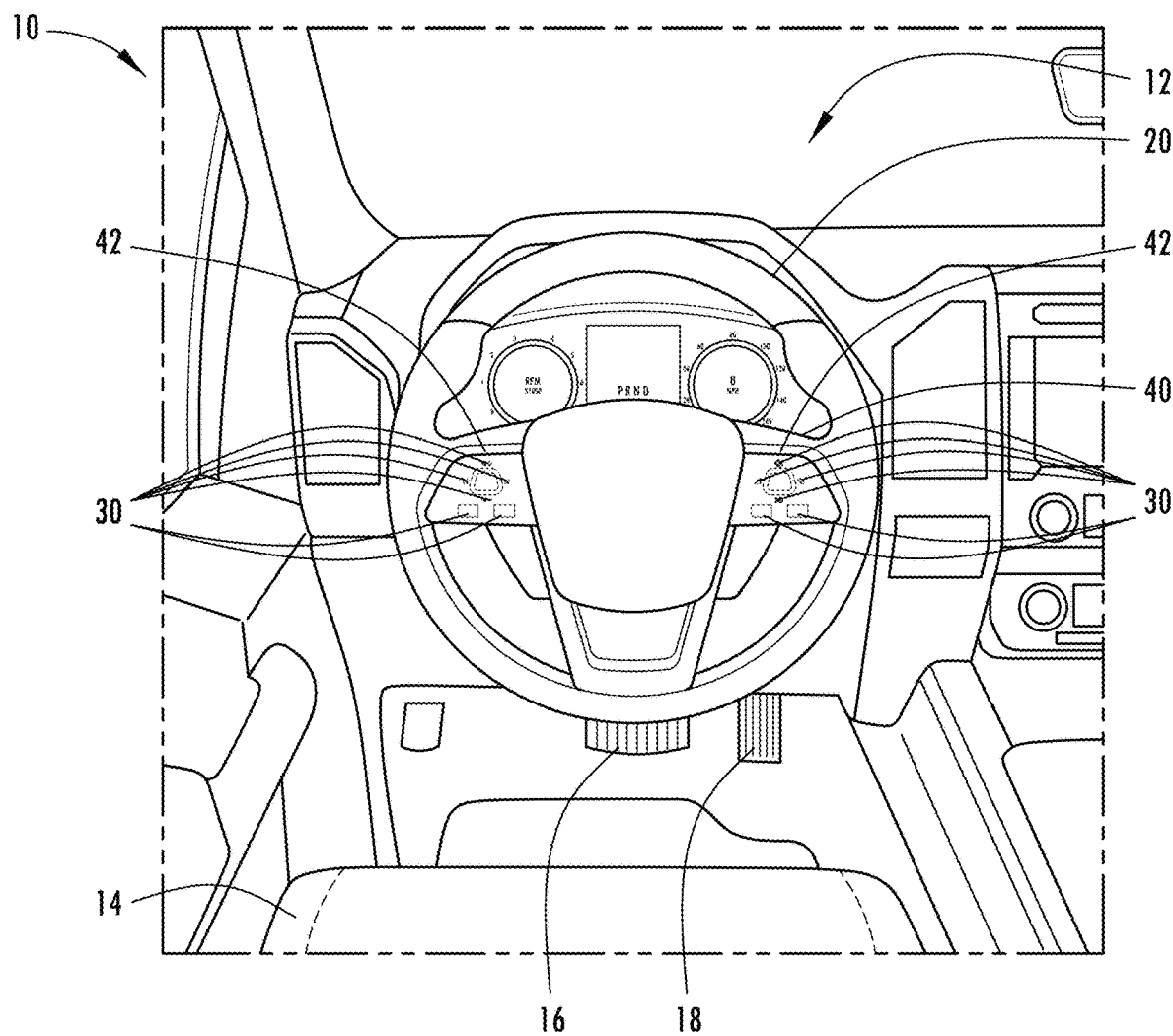
FIG. 1 is a front perspective view of the interior of an automotive vehicle having a steering wheel with capacitive proximity switches, according to one example.

For purposes of description herein, the terms "upper," "lower," "right," "left," "rear," "front," "vertical," "horizontal," and derivatives thereof shall relate to the concepts as oriented in FIG. 1. However, it is to be understood that the concepts may assume various alternative orientations, except where expressly specified to the contrary. It is also to be understood that the specific devices and processes illustrated in the attached drawings, and described in the following specification are simply exemplary embodiments of the inventive concepts defined in the appended claims. Hence, specific dimensions and other physical characteristics relating to the embodiments disclosed herein are not to be considered as limiting, unless the claims expressly state otherwise.

The present illustrated embodiments reside primarily in combinations of method steps and apparatus components related to steering wheel switches and reducing the likelihood of false actuation of the switches. Accordingly, the apparatus components and method steps have been represented, where appropriate, by conventional symbols in the drawings, showing only those specific details that are pertinent to understanding the embodiments of the present disclosure so as not to obscure the disclosure with details that will be readily apparent to those of ordinary skill in the art having the benefit of the description herein. Further, like numerals in the description and drawings represent like elements.

As used herein, the term "and/or," when used in a list of two or more items, means that any one of the listed items can be employed by itself, or any combination of two or more of the listed items, can be employed. For example, if a composition is described as containing components A, B, and/or C, the composition can contain A alone; B alone; C alone; A and B in combination; A and C in combination; B and C in combination; or A, B, and C in combination.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "comprises . . . a" does not, without more constraints, preclude the existence of additional identical elements in the process, method, article, or apparatus that comprises the element.

As used herein, the term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. When the term "about" is used in describing a value or an end-point of a range, the disclosure should be understood to include the specific value or end-point referred to. Whether or not a numerical value or end-point of a range in the specification recites "about," the numerical value or end-point of a range is intended to include two embodiments: one modified by "about," and one not modified by "about." It will be further understood that the end-points of each of the ranges are significant both in relation to the other end-point, and independently of the other end-point.

The terms "substantial," "substantially," and variations thereof as used herein are intended to note that a described feature is equal or approximately equal to a value or description. For example, a "substantially planar" surface is intended to denote a surface that is planar or approximately planar. Moreover, "substantially" is intended to denote that two values are equal or approximately equal. In some embodiments, "substantially" may denote values within about 10% of each other, such as within about 5% of each other, or within about 2% of each other.

As used herein the terms "the," "a," or "an," mean "at least one," and should not be limited to "only one" unless explicitly indicated to the contrary. Thus, for example, reference to "a component" includes embodiments having two or more such components unless the context clearly indicates otherwise.

Figure 2:
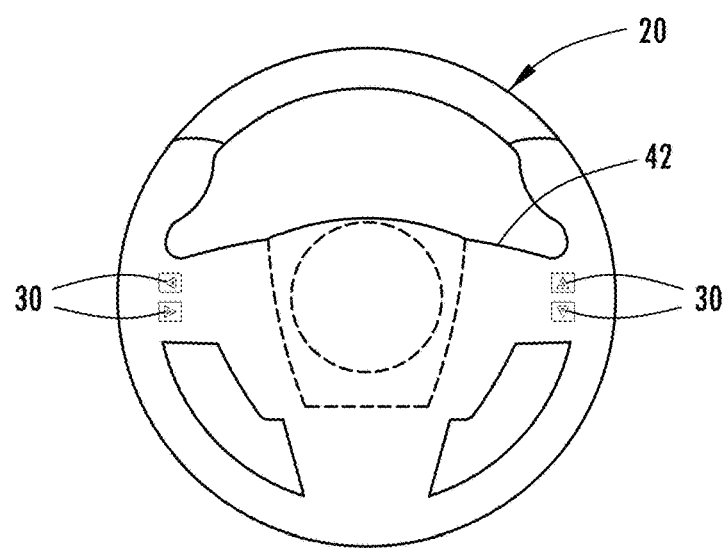
FIG. 2 is a rear perspective view of the steering wheel shown in FIG. 1 further illustrating capacitive proximity switches on a rear side thereof.

Referring to FIGS. 1 and 2, a steering wheel 20 is generally illustrated located within a cabin interior 12 of a motor vehicle 10. The vehicle 10 may be a wheeled motor vehicle employing the steering wheel 20 for steering the direction of steerable wheels, such as for a car, a truck, a bus, a van, a sport utility vehicle (SUV) or for steering other steerable vehicles having a steering wheel such as a boat. The vehicle 10 generally has a body defining the cabin interior 12 and one or more seats 14 shown as the driver seat positioned rearward of the steering wheel 20 to enable the seated driver to engage and operate the steering wheel 20 with his or her hands to rotate the steering wheel 20 in clockwise and counter-clockwise directions. The steering wheel 20 is generally shown extending vehicle rearward from a dashboard and is forward of the driver seat 14 as is common in driver steered vehicles.

The motor vehicle 10 also includes an arrangement of operator controlled pedals for allowing the operator (driver) of the vehicle 10 to accelerate and brake to decelerate the vehicle 10, in addition to steering the vehicle with the steering wheel 20. The pedal assembly includes a brake pedal 16 located at a position forward of the driver seat 14 and above a floor of the vehicle 10. The brake pedal 16 enables the driver to depress the brake pedal 16 via a foot to brake and cause the vehicle to decelerate by actuating the vehicle brakes. The brake pedal 16 has a brake pedal sensor for sensing position and speed of movement of the brake pedal which is indicative of the amount of braking and deceleration of the vehicle. In addition, the pedal assembly includes an accelerator pedal 18 likewise positioned forward of the driver seat 14 and above the floor of the vehicle 10. The accelerator pedal 18 enables the driver to depress the pedal 18 via a foot to accelerate the vehicle 10 via the powertrain (e.g., engine or motor). The accelerator pedal 18 has an accelerator pedal sensor for sensing position and speed of movement of the accelerator pedal 18 which is indicative of the amount of acceleration of the vehicle. It should be appreciated that depressing the brake pedal 16 to cause a vehicle deceleration may cause a seated driver to move in the forward direction, whereas depressing the accelerator pedal 18 may result in an acceleration which may cause the driver to move rearward.

The steering wheel 20 is shown having a ring-shaped rim 40 and one or more spokes 42 and other connecting structure that may form a hub and interconnects the rim 40 with a steering wheel shaft that rotates with rotation of the steering wheel 20. A steering wheel angle sensor, such as an optical sensor, may be provided or coupled to the steering wheel shaft to sense rotational position and speed of rotation of the steering wheel 20. Various components may be assembled onto the one or more spokes 42 and hub including an operator actuatable horn, an airbag, and various user input switches, such as capacitive proximity switches that may be used to control various inputs to the vehicle. For example, the input proximity switches 30 may serve to provide inputs for audio and entertainment inputs, HVAC inputs, speed control inputs such as cruise control, and other user control inputs.

The input proximity switches 30 may be located on the front side of the steering wheel 20 as illustrated in FIG. 1. In addition, input proximity switches 30 may be located on the rear side of the steering wheel 20 as illustrated in FIG. 2.

According to one embodiment, the input proximity switches are configured as capacitive proximity sensors, each configured to operate to sense an input command from a user such as the hand or one or more fingers on the hand detected contacting or in close proximity to the capacitive proximity switch. The capacitive proximity switches may include a first electrode configured as a drive electrode and a second electrode configured as a receive electrode, each having interdigitated fingers for generating a capacitive field. The first electrode may receive square wave drive signal pulses applied at a voltage and the second electrode may have an output for generating an output voltage. It should be appreciated that the first and second electrodes and corresponding electrode fingers may be arranged in various configurations for generating the capacitive field as the sense activation field, according to various embodiments. It should also be appreciated that the first and second electrodes may otherwise be configured so that other types of single electrode sensors or other multiple electrode sensors may be used.

According to one example, the first electrode may be supplied with an input voltage as square wave signal pulses having a charge pulse cycle sufficient to charge the second electrode to a desired voltage. The second electrode thereby serves as a measurement electrode. When a hand or finger is detected via touch or pressure, the hand or pressure causes a disturbance in the activation field which generates a signal that is processed to determine the presence or pressure of the hand. The disturbance of the activation field is detected by processing the charge pulse signals. As a result, a capacitive signal is generated by the respective capacitive switch which may then be used as an input to control a device on the vehicle.

While capacitive proximity switches 30 are shown located on the steering wheel, it should be appreciated that the switches may otherwise be configured. For example, the switches 30 may be configured as mechanical switches that are depressible to generate an input signal to control a device. The switches 30 may be configured as proximity switches using induction or resistance, according to further examples.

Figure 3:
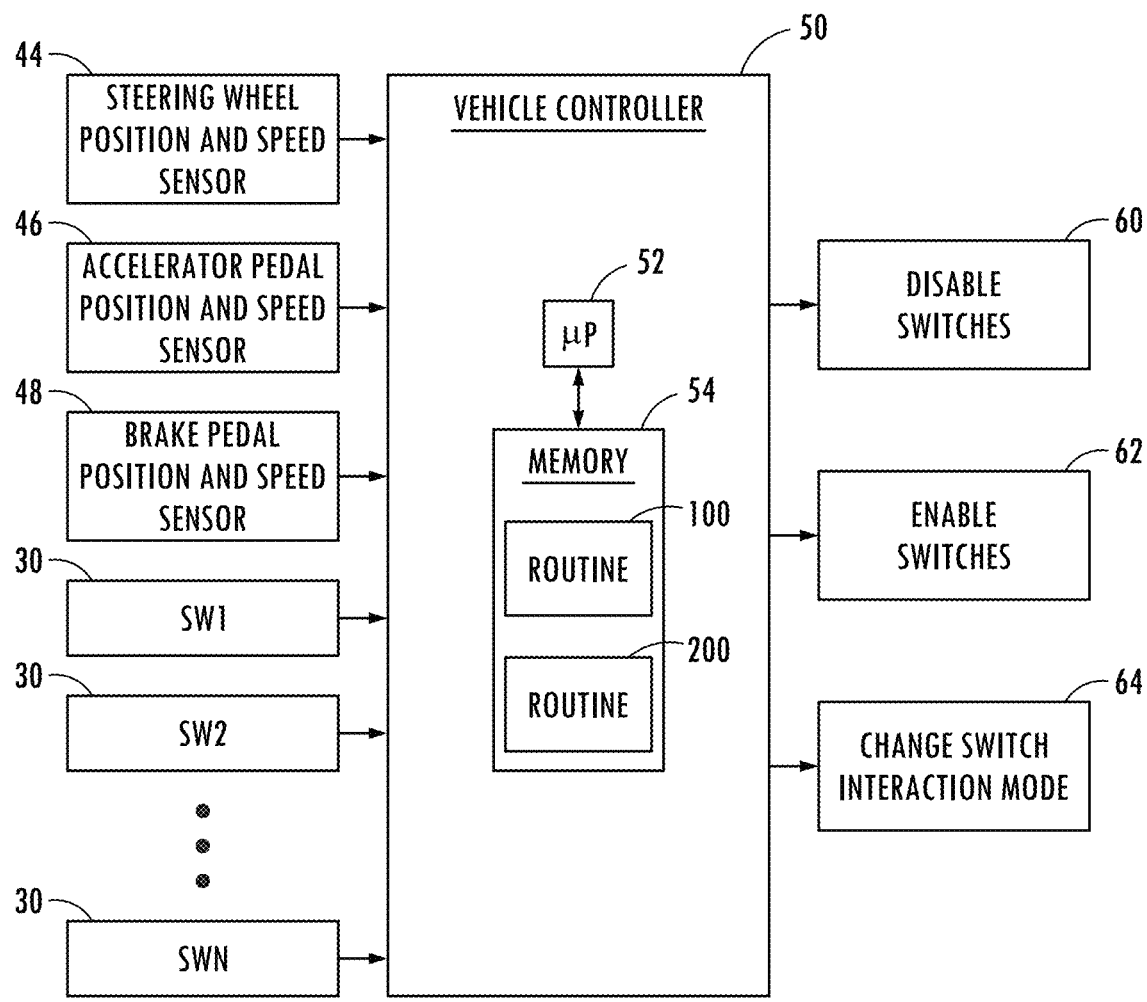
FIG. 3 is a block diagram illustrating a controller for controlling the capacitive proximity switches to reduce the likelihood of false actuations, according to one embodiment.

Referring to FIG. 3, the vehicle 10 includes a controller 50 configured to process the steering wheel position and speed signal generated by the steering wheel sensor 44 and one or more of the pedal assembly inputs including the accelerator pedal position and speed signal generated by the accelerator pedal sensor 46 and the brake pedal position and speed signal generated by the brake pedal sensor 48. The vehicle controller 50 may include control circuitry, such as a microprocessor 52 and memory 54. It should be appreciated that the vehicle controller 50 may be comprised of analog and/or digital control circuitry. Stored in memory 54 are first and second routines 100 and/or 200 for processing the accelerator pedal sensor signal, the brake pedal sensor signal and the steering wheel sensor signal and processing and controlling each of the input proximity switches 30 and controlling an interaction mode with the switches based on the sensed inputs. The controller 50 may thereby change an interaction mode of the input proximity switches 30 based on the sensed steering wheel position and/or speed of movement, the sensed accelerator pedal position and/or speed and the brake pedal position and/or speed. In one embodiment, the vehicle controller 50 may change the interaction mode to disable the input switches 30 with output 60 when the steering wheel position or speed exceeds a corresponding threshold and one of the brake and acceleration position or speeds exceeds a corresponding threshold to reduce the likelihood of false actuations of the input switches 30. According to another embodiment, the vehicle controller 50 may change a switch activation mode from a first mode such as a capacitive touch command mode to a second interaction mode with output 64 such as to a gesture command input or double tap command input to thereby reduce the likelihood of false actuations of the proximity switches 30.

Figure 4:
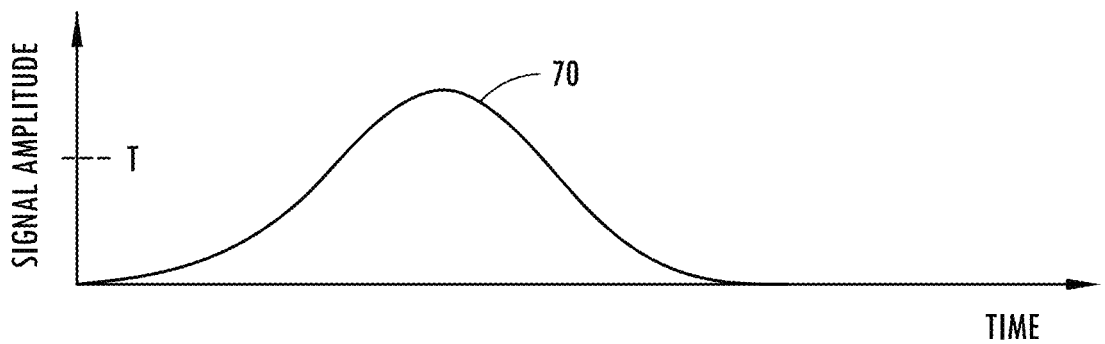
FIG. 4 is a graph illustrating a sensed signal generated by a capacitive proximity switch during a first interaction mode using a touch command.
Figure 5:
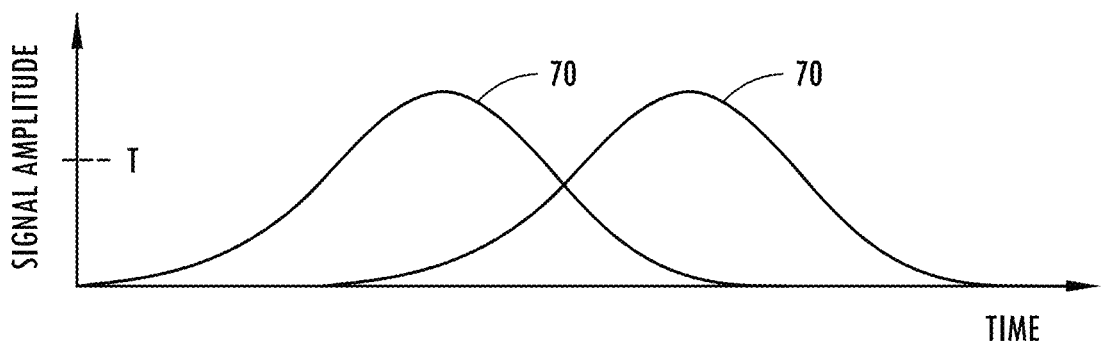
FIG. 5 is a graph illustrating sensed signals from capacitive proximity switches in a second interaction mode using sliding gesture commands, according to one example.
Figure 6:
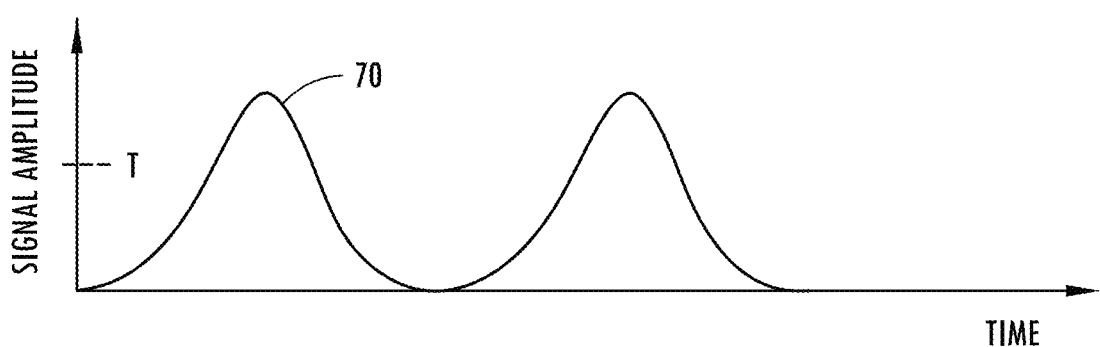
FIG. 6 is a graph illustrating a sensed signal from a capacitive proximity switch in a second interaction mode using a double tap command, according to another example.

Each of the capacitive proximity switches 30 may operate in a first interaction mode that senses touch or close proximity of a user's finger to the proximity switch and generates a switch output based on processing a signal 70 generated by the switch, as shown in FIG. 4 according to one example. The switch activation may occur when the signal 70 exceeds a threshold T, according to one example. Each of the proximity switches 30 may operate in a second interaction mode as shown in FIG. 5 in which sensed signals 70 from first and second capacitive proximity switches are used to detect a gesture movement of a user's finger sliding across the two switches before activating one or both of the switches. In the second interaction mode, a more sophisticated input command is required by the user such that a single tap input command which may otherwise cause a false actuation is avoided. In an alternate embodiment, the second interaction mode may be configured to require a double tap input command as is shown by signal 70 in FIG. 6. In this embodiment, the double tap input command is shown by signal 70 rising to a first peak, dropping and then rising again to a second peak. The controller 50 may look for the occurrence of two peaks above threshold T within a time period to determine a double tap activation of the switch. The second interaction mode may be a disabled mode, according to another example.

Figure 7A:
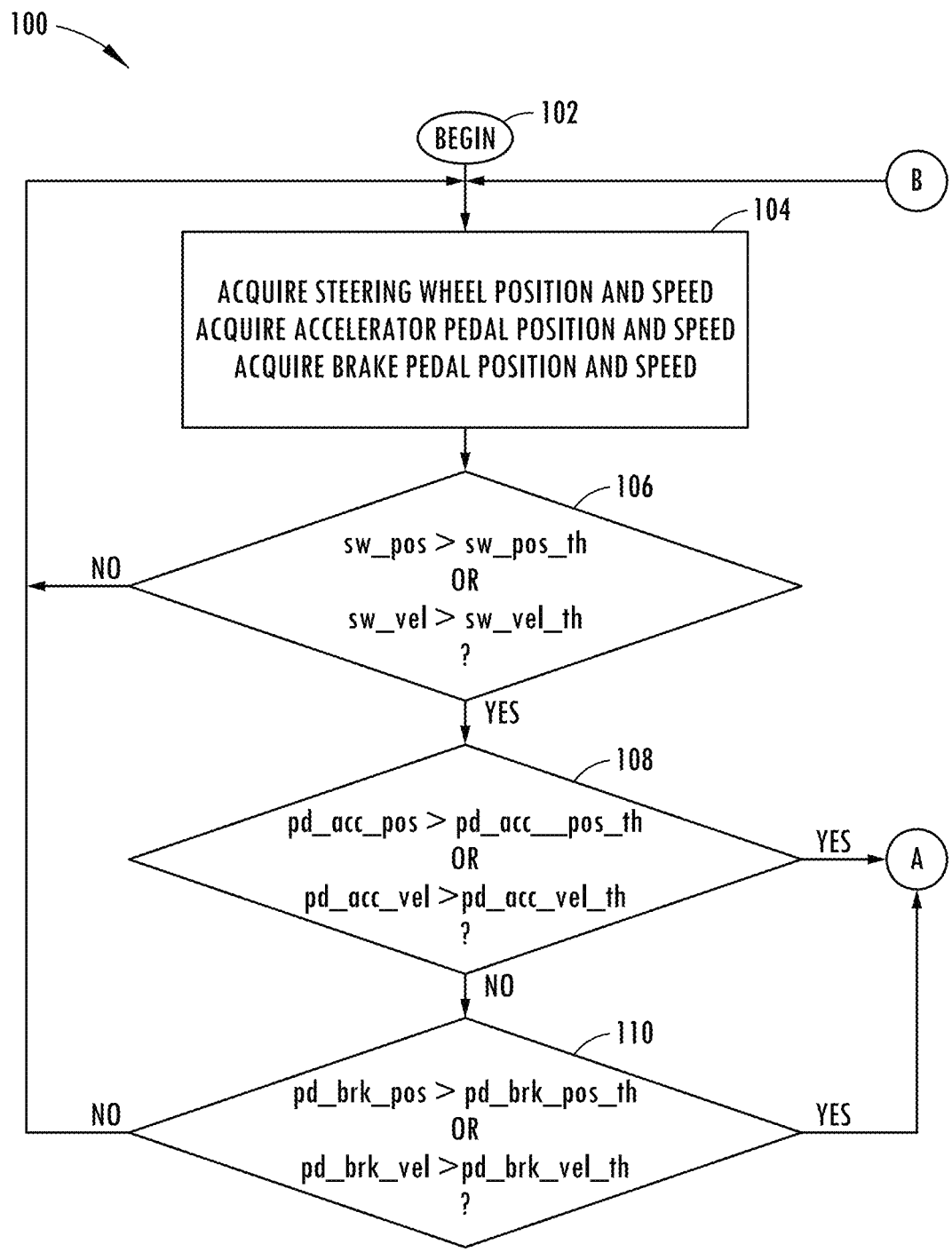
FIGS. 7A and 7B is a flow diagram illustrating a routine for controlling the capacitive proximity switches and disabling switches to reduce the likelihood of false actuations, according to one embodiment.
Figure 7B:
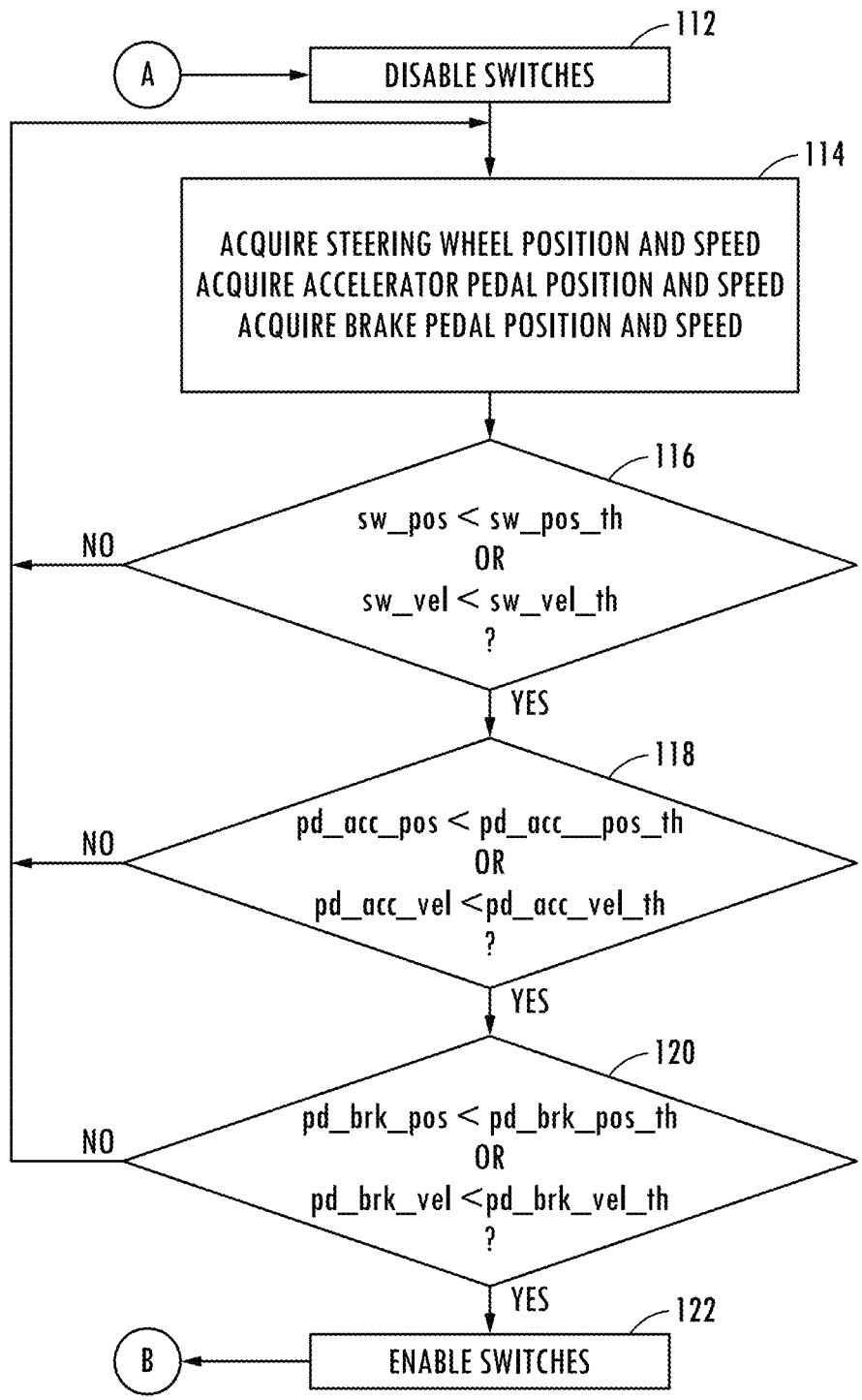

Referring to FIGS. 7A and 7B, a routine 100 for controlling activation of the proximity switches and reducing the likelihood of false actuations is provided, according to one embodiment. Routine 100 begins at step 102 and proceeds to step 104 to acquire the sensed steering wheel position and speed, to acquire the sensed accelerator pedal position and speed, and to acquire the sensed brake pedal position and speed. Each of the positions and speeds are acquired with the sensors associated with the steering wheel, the accelerator pedal and the brake pedal. Next, at decision step 106, routine 100 determines if the steering wheel position sw_pos is greater than a threshold position sw_pos_th or if the steering wheel velocity or speed sw_vel is greater than a threshold speed sw_vel_th and, if not, returns to step 104. If either the position or speed of the steering wheel exceeds the corresponding thresholds, routine 100 proceeds to decision step 108 to determine if the accelerator pedal position pd_acc_pos or accelerator pedal speed pd_acc_vel exceeds respective position threshold pd_acc_pos_th and speed threshold pd_acc_vel_th and, if not, returns to step 104. If either of the accelerator pedal position or speed exceeds the corresponding thresholds, routine 100 proceeds to step 110 to determine the brake pedal position pd_brk_pos exceed a position threshold pd_brk_pos_th or if the brake pedal speed pd_brk_vel exceeds the speed threshold pd_brk_vel_th and, if not, returns to step 104. If the accelerator pedal or brake pedal position or speed exceeds either of the thresholds, routine 100 proceeds to step 112 to disable the switches on the steering wheel so as to prevent false actuations of the switches that may otherwise occur during the movement of the steering wheel during dynamic vehicle driving events. For example, if the vehicle is accelerating while a driver is manipulating the steering wheel in a counter or clockwise motion, the driver may inadvertently touch and thereby actuate one or more of the capacitive proximity switches, such as the switches found on the rear side of the steering wheel. If the vehicle is sufficiently braking, a user may inadvertently actuate one or more of the capacitive proximity switches on the front side of the steering wheel. By monitoring for the dynamic acceleration or deceleration event of the vehicle and the movement of the steering wheel, the likelihood of false activations of the input switches may be reduced.

With the proximity switches disabled at step 112, routine 100 proceeds to step 114 to acquire the steering wheel position and speed, the accelerator pedal position and speed, and the brake pedal position and speed. Next, routine 100 proceeds to decision step 116 to determine if the steering wheel position sw_pos is greater than a threshold position sw_pos_th or if the steering wheel velocity or speed sw_vel is greater than a threshold speed sw_vel_th and, if not, returns to step 114. If either the position or speed of the steering wheel exceeds the corresponding thresholds, routine 100 proceeds to decision step 118 to determine if the accelerator pedal position pd_acc_pos or accelerator pedal speed pd_acc_vel exceeds respective position threshold pd_acc_pos_th and speed threshold pd_acc_vel_th and, if not, returns to step 114. If either the accelerator pedal or speed exceeds the corresponding thresholds, routine proceeds to decision step 120 to determine if the brake pedal position pd_brk_pos exceeds a position threshold pd_brk_pos_th or if the brake pedal speed pd_brk_vel exceeds the speed threshold pd_brk_vel_th and, if not, returns to step 114. If the accelerator pedal and brake pedal position and speeds exceeds either of the thresholds, routine 100 proceeds to step 122 to enable the switches. As such, the switches may be enabled when the steering wheel position and speed, accelerator pedal position and speed and brake pedal position and speed are less than predetermined thresholds to enable normal usage of the proximity switches during normal driving when the steering wheel is not in motion beyond a limit and vehicle dynamics are more stable.

Figure 8A:
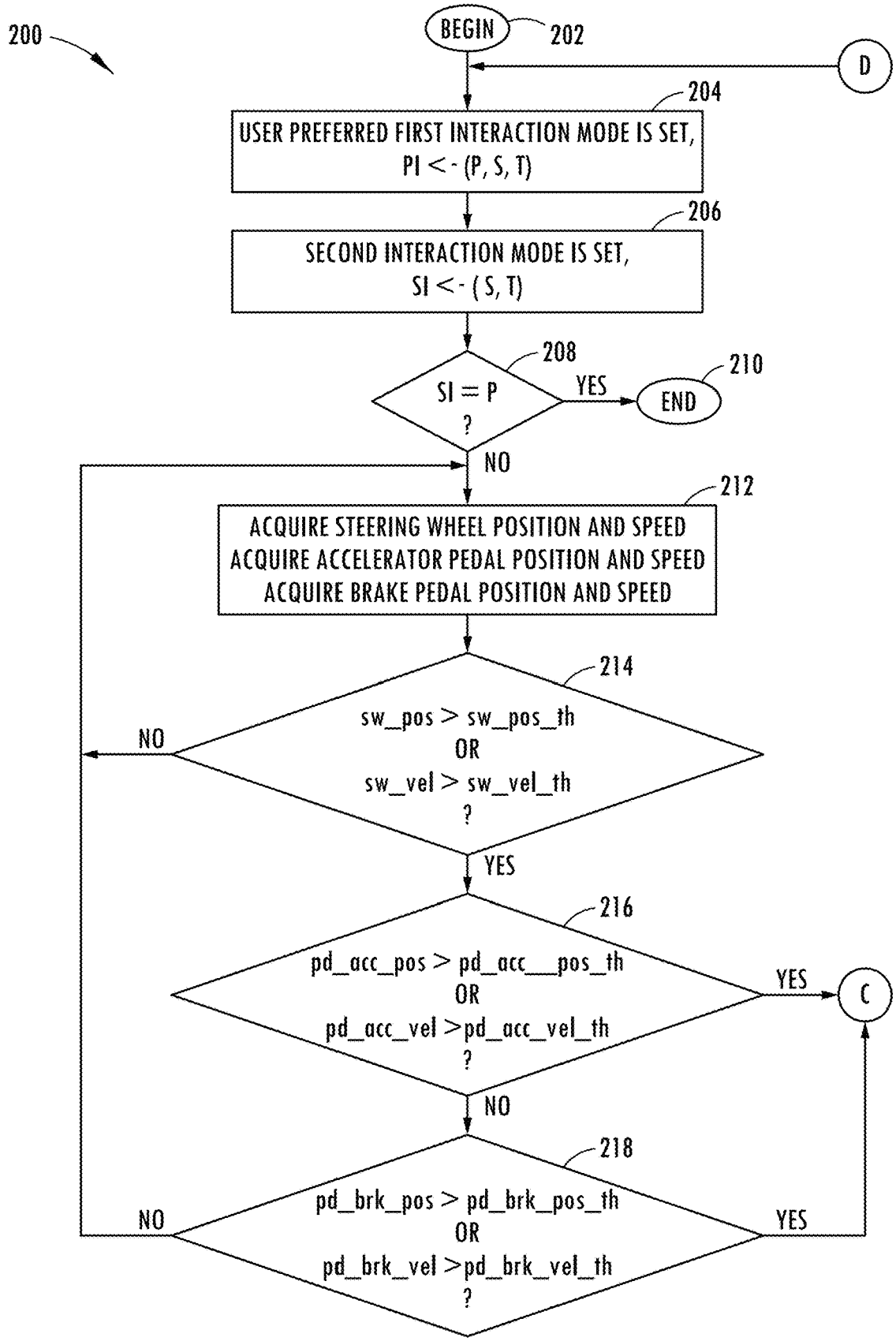
FIGS. 8A and 8B is a flow diagram illustrating a routine for controlling the capacitive proximity switches to switch between interaction modes to reduce the likelihood of false actuations, according to another embodiment.
Figure 8B:
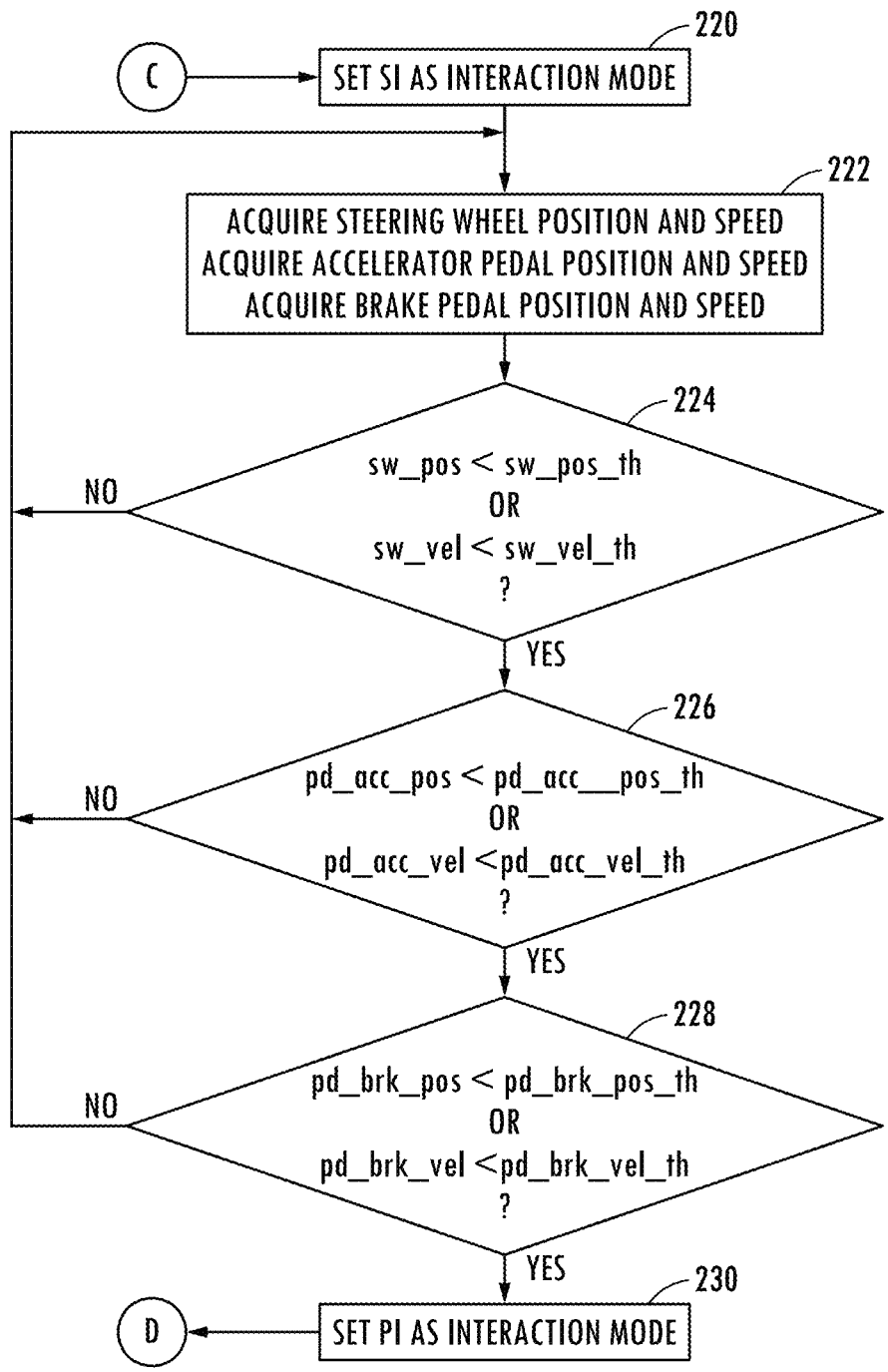

Referring to FIGS. 8A and 8B, a routine 200 is shown for switching the interaction mode of the proximity switches between two interaction modes to reduce the likelihood of false actuations of the switches, according to another embodiment. In this embodiment, routine 200 begins at step 202 and proceeds to step 204 to set a user preferred first interaction mode (PI). Next, at step 206, routine 200 sets a second interaction mode (SI) in which the switches require a different signal activation. Routine 200 then proceeds to decision step 208 to determine if the second interaction mode is a press or touch mode (P), and if so, ends at step 210. If the second interaction mode is not the touch mode, routine 200 proceeds to step 212 to acquire the steering wheel position and speed, to acquire acceleration pedal position and speed and to acquire the brake pedal position and speed. Next, at decision step 214, routine 200 determines if the steering wheel position sw_pos is greater than a threshold sw_pos_th or if the steering wheel speed sw_vel is greater than a threshold sw_vel_th and, if not, returns to step 212. Otherwise, routine 200 proceeds to decision step 216 to determine if the accelerator pedal position pd_acc_pos or speed pd_acc_vel exceeds the corresponding position threshold pd_acc_pos_th and speed threshold pd_acc_vel_th and, if not, returns to step 222. Routine 200 then proceeds to decision step 218 to determine if the brake pedal position pd_brk_pos exceeds a threshold pd_brk_pos_th or if the brake pedal speed pd_brk_vel is greater than a threshold pd_brk_vel_th and, if not, returns to step 212. If either of the accelerator pedal positions and speeds exceeds a predetermined position and thresholds, routine 200 proceeds to step 220 to change the interaction mode to set the interaction mode as the second interaction mode. In the second interaction mode, the capacitive switches may be activated with a more complex input, such as a double tap or a sliding gesture, as opposed to a single touch input.

Once in the second interaction mode, routine 200 proceeds to step 222 to acquire to steering wheel position and speed, the accelerator pedal position and speed, and the brake pedal position and speed. Next, routine 200 proceeds to decision step 224 to determine if the steering wheel position sw_pos is less than a threshold sw_pos_th and if the steering wheel speed sw_vel is less than a threshold sw_vel_th and, if not, returns to step 222 to remain in the second interaction mode. If the steering wheel position and speed are less than the predetermined thresholds, routine 200 proceeds to decision step 226 to determine if the accelerator pedal position pd_acc_pos is less than a threshold pd_acc_pos_th and if the accelerator pedal speed pd_acc_vel is less than a threshold pd_acc_vel_th and, if not, returns to step 222 to remain in the second interaction mode. If the accelerator pedal position and speed are both less than the predetermined thresholds, routine 200 proceeds to decision step 228 to determine if the brake pedal position pd_brk_pos is less than a threshold pd_brk_pos_th and if the brake pedal speed is less than a threshold pd_brk_vel_th and, if not, returns to step 222 to remain in the second interaction mode. If the conditions of decision steps 224, 226 and 228 are met such that the steering wheel position and velocity is less than the predetermined thresholds, the position and velocity of the accelerator pedals is less than the predetermined thresholds, and the position and speed of the brake pedal is less than the predetermined thresholds, routine 200 proceeds to step 230 to change the interaction mode back to the preferred first interaction mode. As a result, the operation of the activation of the proximity switches returns to the first interaction mode. In the second interaction mode, the capacitive switches may require a gesture or double tap input, as opposed to single tap input in the first interaction mode, according to one example. Routine 200 proceeds to step 220 to acquire the steering wheel position and speed, to acquire the acceleration pedal position and speed, and to acquire the brake pedal position and speed. Thereafter, routine 200 proceeds to decision step 222 to determine if the steering wheel position or speed are greater than the corresponding position or speed thresholds and, if not, returns to step 220. If the steering wheel position or speed are greater than the corresponding position or speed thresholds, routine 222 proceeds to step 224 to determine if either of the pedal position and speeds are less than a threshold position or speed and, if so, sets the capacitive switches to the first interaction mode at step 226. Otherwise, routine 200 returns to step 220.

Accordingly, the vehicle advantageously monitors the motion of the steering wheel and dynamic conditions related to acceleration and deceleration of the vehicle and disables or changes the interaction mode of the switches based on the monitored signals. As a result, the potential for false actuations of proximity switches is thereby reduced.

It is to be understood that variations and modifications can be made on the aforementioned structure without departing from the concepts of the present invention, and further it is to be understood that such concepts are intended to be covered by the following claims unless these claims by their language expressly state otherwise.

What is claimed is:

1. A vehicle comprising:
a steering wheel;
a steering wheel sensor sensing rotational movement of the steering wheel;
an accelerator pedal actuatable to accelerate the vehicle;
a brake pedal actuatable to decelerate the vehicle;
a sensor sensing a sensed signal indicative of an acceleration or deceleration of the vehicle;
at least one input switch located on the steering wheel and configured to sense an input command from a user; and
a controller configured to process the sensed signal and the sensed rotational movement of the steering wheel and control an interaction mode of the at least one input switch, wherein the controller changes the interaction mode of the at least one input switch based on the sensed steering wheel movement and the sensed signal.

2. The vehicle of claim 1, wherein the sensed signal is generated by a sensor sensing position or speed of the accelerator pedal.

3. The vehicle of claim 1, wherein the sensed signal is generated by a sensor sensing position or speed of the brake pedal.

4. The vehicle of claim 1, wherein the controller detects the sensed steering wheel movement exceeding a first threshold, and detects the sensed signal exceeding a second threshold.

5. The vehicle of claim 1, wherein the at least one proximity switch comprises a capacitive switch.

6. The vehicle of claim 5, wherein the change in the interaction mode comprises disabling the capacitive switch.

7. The vehicle of claim 6, wherein the controller further enables the capacitive switch based on the sensed steering wheel movement and the sensed signal.

8. The vehicle of claim 5, wherein the change in interaction mode comprises changing the interaction mode from a first interaction mode to a second interaction mode.

9. The vehicle of claim 8, wherein the first interaction mode comprises operating the capacitive switch with single touch and wherein the second interaction mode comprises operating the capacitive switch with at least one of a sliding gesture and double tap.

10. The vehicle of claim 1, wherein the sensed rotational movement of the steering wheel comprises sensed change in position of the steering wheel.

11. The vehicle of claim 1, wherein the sensed rotational movement of the steering wheel comprises speed of rotation of the steering wheel.

12. A vehicle comprising:
a steering wheel;
a steering wheel sensor sensing rotational movement of the steering wheel;
an accelerator pedal having a first sensor for sensing an acceleration signal indicative of an acceleration of the vehicle;
a brake pedal having a second sensor generating a brake signal indicative of braking of the vehicle;
at least one proximity switch located on the steering wheel and configured to sense an input command from a user; and
a controller configured to process the sensed acceleration signal, the sensed brake signal, and sensed rotational movement of the steering wheel and controlling an interaction mode of the at least one proximity switch, wherein the controller changes the interaction mode of the at least one proximity switch based on the rotational movement of the steering wheel movement and at least one of the sensed acceleration signal and the sensed brake signal.

13. The vehicle of claim 12, wherein the controller detects the sensed movement of the steering wheel exceeding a predetermined first threshold, and detects at least one of the sensed acceleration signal and sensed braking signal exceeding a second threshold.

14. The vehicle of claim 12, wherein the at least one proximity switch comprises a capacitive switch.

15. The vehicle of claim 14, wherein the change in interaction mode comprises changing the interaction mode from a first interaction mode to a second interaction mode.

16. The vehicle of claim 15, wherein the first interaction mode comprises operating the capacitive switch with single touch and wherein the second interaction mode comprises operating the capacitive switch with at least one of a sliding gesture and double tap.

17. A method of controlling at least one proximity switch on a steering wheel of a vehicle, the method comprising:
sensing rotational movement of the steering wheel;
sensing acceleration of the vehicle;
sensing braking of the vehicle;
allowing at least one input switch to operate in a first activation mode when the steering wheel rotational movement is less than a first threshold, wherein the at least one input switch is configured to sense an input command from a user; and
operating the at least one input switch in a second interaction mode when the rotational movement of the steering wheel is greater than the first threshold and at least one of acceleration signal and braking signal is greater than a second threshold.

18. The method of claim 17, wherein the first interaction mode is a normal operation mode and the second interaction mode is a disabled mode that disables the at least one input switch.

19. The method of claim 17, wherein the at least one input switch comprises at least one capacitive switch.

20. The method of claim 19, wherein the first interaction mode comprises operating the at least one capacitive switch in a touch mode and the second interaction mode comprises operating the at least one capacitive switch with one of sliding gesture and double tap.

\* \* \* \* \*